(12) United States Patent
Gopalraja et al.

(10) Patent No.: US 6,193,855 B1
(45) Date of Patent: Feb. 27, 2001

(54) USE OF MODULATED INDUCTIVE POWER AND BIAS POWER TO REDUCE OVERHANG AND IMPROVE BOTTOM COVERAGE

(75) Inventors: Praburam Gopalraja, Sunnyvale; John Forster, San Francisco, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/421,431

(22) Filed: Oct. 19, 1999

(51) Int. Cl.$^7$ .................................................. C23C 14/34
(52) U.S. Cl. .............................. 204/192.12; 204/298.06; 204/298.08
(58) Field of Search ...................... 204/192.12, 298.06, 204/298.08

(56) References Cited

U.S. PATENT DOCUMENTS

| | | | |
|---|---|---|---|
| 3,410,774 | 11/1968 | Barson et al. | 204/192 |
| 4,874,493 | 10/1989 | Pan | 204/192.11 |
| 4,963,239 | 10/1990 | Shimamura et al. | 204/192.12 |
| 4,999,096 | 3/1991 | Nihei et al. | 204/192.3 |
| 5,510,011 | 4/1996 | Okamura et al. | 204/192.3 |
| 5,585,974 | 12/1996 | Shrinkle | 360/46 |
| 5,639,357 | 6/1997 | Xu | 204/192.3 |
| 5,651,865 | 7/1997 | Sellers | 204/192.13 |
| 5,718,813 | 2/1998 | Drummond et al. | 204/192.12 |
| 5,770,023 | 6/1998 | Sellers | 204/192.3 |
| 5,780,357 | 7/1998 | Xu et al. | 438/639 |
| 5,800,688 | * 9/1998 | Lantsman et al. | 204/298.11 |
| 5,807,467 | 9/1998 | Givens et al. | 204/192.12 |
| 5,810,982 | 9/1998 | Sellers | 204/298.08 |
| 5,830,330 | 11/1998 | Lantsman | 204/192.12 |
| 5,863,392 | 1/1999 | Drummond et al. | 204/192.12 |
| 5,976,327 | * 11/1999 | Tanaka | 204/192.15 |
| 6,001,420 | * 12/1999 | Mosley et al. | 427/258 |

OTHER PUBLICATIONS

Merriam–Webster's Collegiate Dictionary, 10th Edition, pp. 748, Dec. 1996.*

* cited by examiner

Primary Examiner—Nam Nguyen
Assistant Examiner—Steven H. VerSteeg
(74) Attorney, Agent, or Firm—Thomason, Moser & Pattersor (57) ABSTRACT

The present invention provides a method and apparatus for achieving conformal step coverage of one or more materials on a substrate using sputtered ionized material. A plasma is struck and maintained in a processing region by coupling energy into one or more gases. A target disposed in the processing region provides a source of material to be sputtered and then ionized in the plasma environment. During deposition of material onto the substrate, the plasma density is modulated by varying the energy supplied to the plasma. During a period of plasma decay, a bias to a substrate support member is increased to a relatively higher power to periodically enhance the attraction of positively charged particles to the substrate during the afterglow period of the plasma. In one embodiment, a bias to the target is also modulated.

26 Claims, 3 Drawing Sheets

USE OF MODULATED INDUCTIVE POWER AND BIAS POWER TO REDUCE OVERHANG AND IMPROVE BOTTOM COVERAGE

BACKGROUND OF THE INVENTION

1. Field of the Invention

The present invention relates to an apparatus and method for processing substrates. Specifically, the invention relates to a method for depositing a conformal layer of material on a substrate in an ionized metal plasma process.

2. Background of the Related Art

Sub-quarter micron multi-level metallization represents one of the key technologies for the next generation of ultra large-scale integration (ULSI) for integrated circuits (IC). In the fabrication of semiconductor and other electronic devices, directionality of particles being deposited on a substrate is important to improve adequate filling of electric features. As circuit densities increase, the widths of vias, contacts and other features, as well as the dielectric materials between them, decrease to 0.25 $\mu$m or less, whereas the thickness of the dielectric layer remains substantially constant. Thus, the ratio of the depth to the minimum lateral dimension (aspect ratio) of the features increases, thereby pushing the aspect ratios of the vias and contacts to 5:1 and above. As the dimensions of the features decrease, it becomes even more important to get directionality in order to achieve conformal coverage of the feature sidewalls and bottoms.

One process capable of providing greater directionality to particles is ionized metal plasma-physical vapor deposition (IMP-PVD), also known as high density physical vapor deposition (HDP-PVD). Initially, a plasma is generated by introducing a gas, such as helium or argon, into the chamber and then applying a negative voltage to a metallic target. The voltage will cause the gas to form a plasma. A coil positioned proximate the processing region of the chamber, and powered with RF energy, produces an electromagnetic field which induces currents in the plasma resulting in an inductively-coupled medium/high density plasma between the target and a susceptor on which a substrate is placed for processing. The positive ions in the plasma are accelerated toward the target by the applied bias causing the sputtering of material from the target by momentum transfer. The sputtered target material is then ionized by interaction with the plasma, thereby producing metal ions in the case of a target comprising a metal. An electric field due to an applied or self-bias, develops in the boundary layer, or sheath, between the plasma and the substrate that accelerates the resultant metal ions towards the substrate in a direction generally parallel to the electric field and perpendicular to the substrate surface exposed to the processing region. The bias energy is preferably controlled by the application of power, such as RF or DC power, to the susceptor to attract the sputtered target ions in a highly directionalized manner to the surface of the substrate to fill the features formed on the substrate. HDP-PVD is particularly beneficial in depositing material on the bottom of the features due to the influence of the substrate bias energy on the target ions. In order to maximize the deposition rate, it is preferred to maximize the substrate bias energy.

One of the problems with HDP-PVD processes is that the applied substrate bias energy also attracts the inert plasma gas ions toward the substrate to cause re-sputtering of the deposited material from the substrate. Re-sputtering of deposited material can result in a phenomenon known as "faceting" whereby the deposited material at the upper end of a feature formed in the substrate is partially etched by the ions from the plasma gas. Under the influence of the substrate bias, the charged particles can gain enough kinetic energy to re-sputter a portion of the deposited material. In particular, the material is re-sputtered from the top corners of the device features, such as vias, and from the fields of the substrate, which are the upper planar areas of the substrate formed between the features. The re-sputtered material then re-deposits on other areas of the substrate, particularly on the upper portion of the features formed on the substrate.

Figure 1:
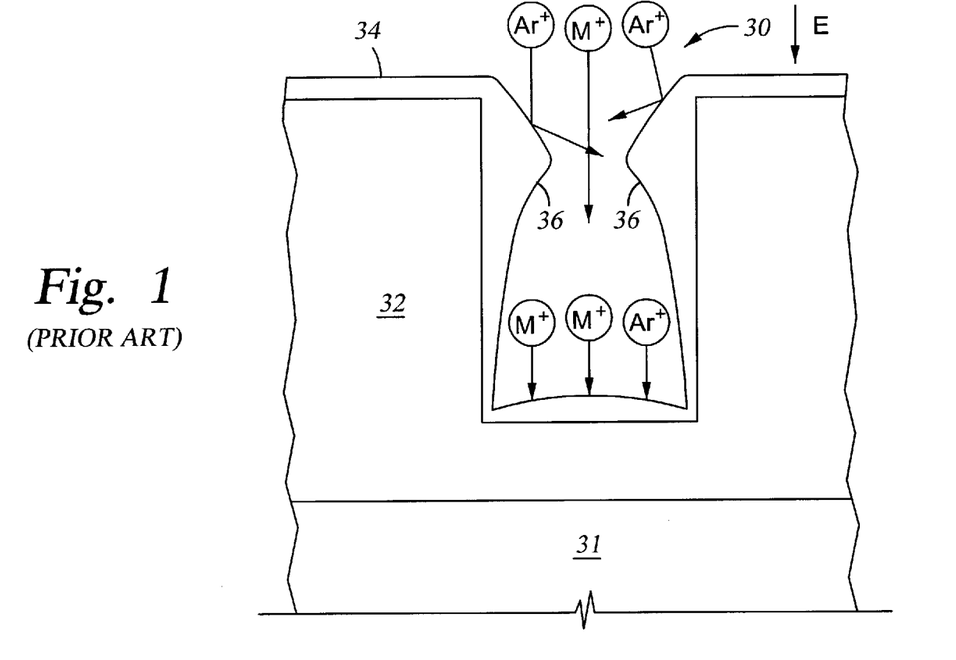
FIG. 1 is a cross section of a via formed in a substrate having a layer formed thereon and illustrating the formation of overhangs due to ion bombardment.
Figure 2:
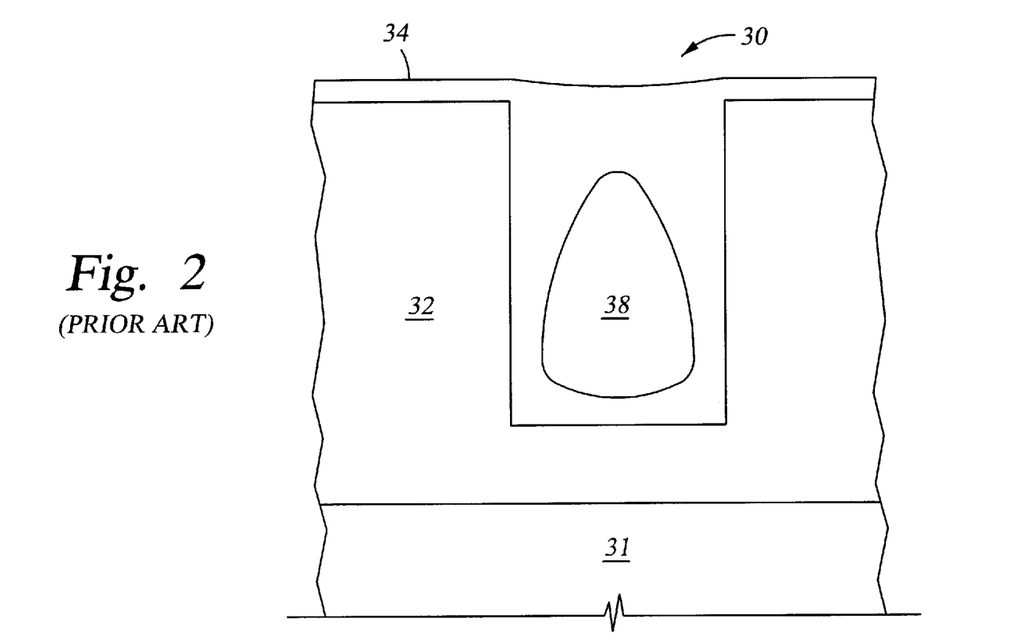
FIG. 2 is a cross section of the via of FIG. 1 having a void formed therein.

Faceting is undesirable because of the potential to form overhangs as illustrated in FIGS. 1–2. FIG. 1 is a cross section of a via 30 formed on a substrate 31. The via 30 is formed in a dielectric layer 32 having a layer 34 disposed thereon, which may be a barrier layer or a seed layer for example. During a conventional HDP-PVD process, a bias on the substrate 31 results in an electric field E oriented substantially perpendicularly to the substrate 31. The electric field E accelerates the nearby positively charged particles toward the substrate 31. While the ions generated from the sputtered material (shown here as metal ions) deposit on the dielectric layer 32 to form the layer 34, the plasma gas ions (shown here as Ar ions) re-sputter the deposited material and produce overhangs 36 which restrict the opening of the via 30. The overhangs 36 are shown as portions of the deposited layer 34 at the upper end of the via 30 which are relatively thicker compared to the other portions of the layer 34 due to greater deposition at those locations on the via 30. As the overhangs 36 continue to accumulate material, entry to the via 30 is restricted and a void 38 is formed, as shown in FIG. 2.

Re-sputtering occurs above a threshold ion energy value below which no re-sputtering occurs. The ion energy is dependent on the voltage drop in the plasma sheath. Metals typically re-sputter at ion energy thresholds that occur between about 20V and 40V. Above the threshold, the re-sputter yield, i.e., the number of metal atoms ejected from the substrate per incident Ar ion, increases with increasing ion energy. Because the ion energy is dependent on the voltage drop in the plasma sheath, re-sputtering is increased as the substrate bias is increased. In most cases, some degree of re-sputtering is acceptable until the ratio of re-sputtering to deposition reaches a critical limit. Accordingly, the maximum value of the bias applied to a substrate is limited before producing detrimental effects such as faceting. As a result, the ability of HDP-PVD processes to control deposition with the bias energy is compromised.

Further, the occurrence of re-sputtering above a threshold ion energy value is related to the process pressure maintained in the chamber. In general, higher pressures result in more ionization of the target material and hence, more particles that can be influenced by the substrate bias. HDP-PVD processes typically require a process pressure between about 15 mTorr and 100 mTorr in order to ensure sufficient ionization of the sputtered target material. However, higher process pressures also result in a higher ratio of the plasma gas ion flux to the metal ion flux due to the greater proportion of plasma gas ionization as compared to metal ionization. As described above, the plasma gas ions are the agents responsible for re-sputtering. Therefore, as the ratio of process gas ions to metal ions increases, the maximum value on the substrate bias energy decreases before re-sputtering occurs.

Therefore, there is a need for a method of depositing a layer conformally over the surface of features wherein overhangs can be controlled and good bottom coverage can be achieved.

SUMMARY OF THE INVENTION

Embodiments of the invention provide a method and apparatus for achieving conformal step coverage of one or more materials on a substrate using sputtered ionized material. In one aspect of the invention, a plasma is struck and maintained in a processing region by coupling energy into one or more gases provided in the processing region. A target disposed in the processing region provides a source of material to be sputtered and then ionized in the plasma environment. During deposition of material onto the substrate, the plasma density is modulated by varying the energy supplied to the plasma. During a period of plasma decay, a bias to a substrate support member is increased to a relatively higher power, thereby periodically enhancing the attraction of positively charged particles to the substrate during the afterglow period of the plasma. The plasma decay is achieved by terminating the coupling of energy into the gases. In one embodiment, a bias to the target is also modulated.

In yet another aspect of the invention, modulated signals are provided to a coil and a substrate support member during a plasma process. A first signal to the coil is modulated between a power ON portion during which a substantially constant level of power is supplied to the coil and a power OFF portion during which no power is supplied to the coil. A second signal to the substrate support member is periodically modulated out of phase with the first signal, i.e., the power supplied by the second signal is increased during the power OFF portion of the first signal.

In still another aspect of the invention, a chamber is provided which includes a target, a substrate support member, a plasma generator to ionize the target material and a plurality of modulated power sources. The target comprises the material to be sputtered by a plasma formed adjacent to the target during processing. In one embodiment, the plasma generator may be one or more single-turn or multi-turn coils adapted to ionize the sputtered material. The plurality of modulated power sources are adapted to supply out-of-phase modulated signals to the plasma generator and to the substrate support member.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The embodiments described below preferably use any deposition apparatus capable of ionizing sputtered material such as an ionized metal plasma (IMP) chamber and an electron cyclotron resonance (ECR) chamber. For simplicity, the following will be described with reference to an IMP processing chamber, such as the IMP VECTRA™ Chamber available from Applied Materials, Inc., of Santa Clara, Calif. However, it is understood that any other physical vapor deposition chamber involving the ionization of a sputtered material in a plasma environment may be used.

Figure 3:
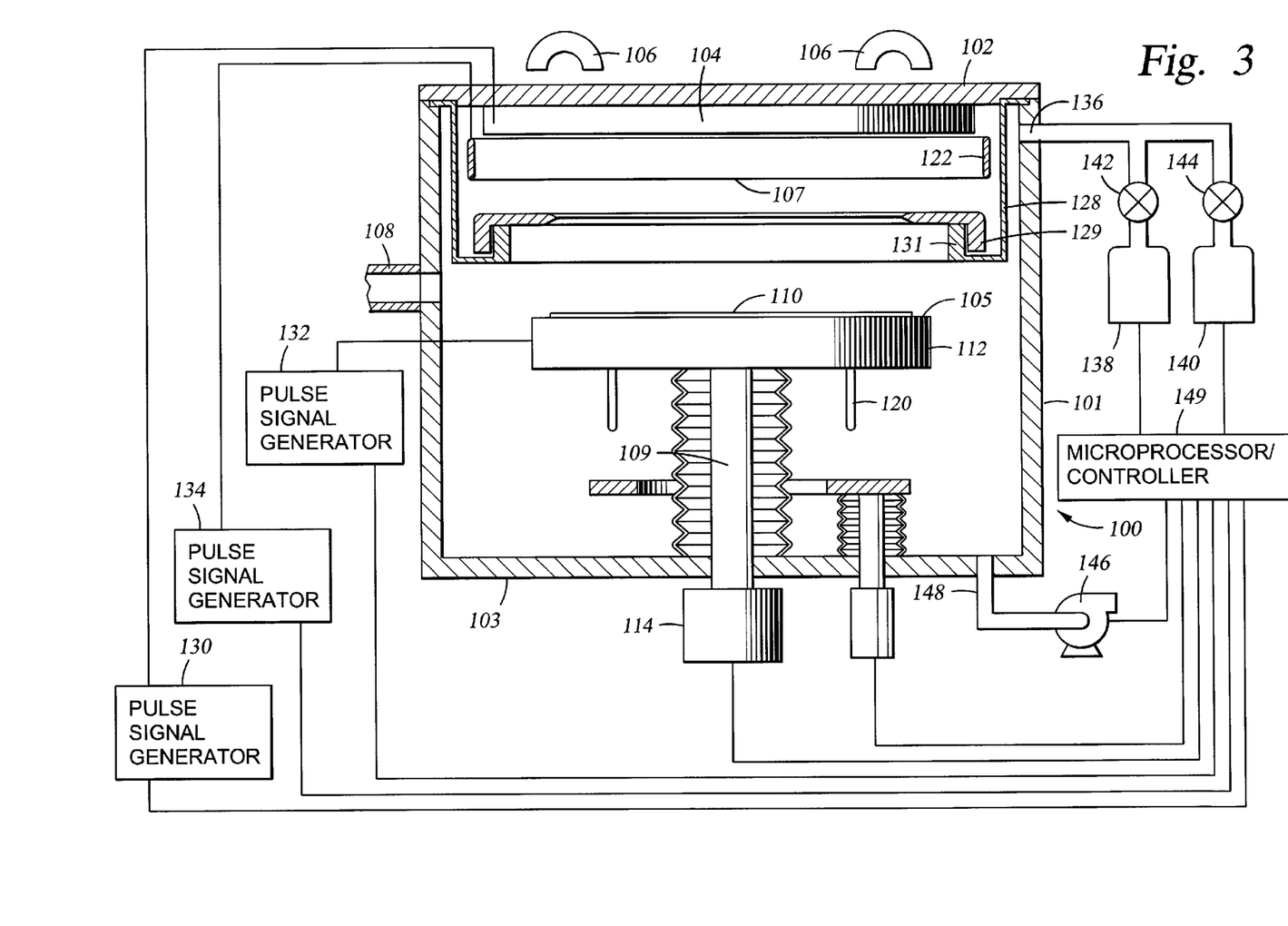
FIG. 3 is a cross section of a simplified processing chamber using a coil.

FIG. 3 is a schematic cross-sectional view of an IMP chamber 100 according to the present invention. The chamber 100 includes walls 101, lid 102, and bottom 103. A target 104 comprising the material to be sputtered is mounted to the lid 102 and disposed in the chamber 100 to define an upper boundary to a processing region 107. Magnets 106 are disposed behind the lid 102 and are part of a rotatable magnetron which trap electrons during operation and increase the density of a plasma adjacent to the target 104.

A substrate support member 112 is movably disposed in the chamber 100 and in a raised processing position defines the lower boundary of the processing region 107. The substrate support member 112 provides an upper support surface 105 for supporting a substrate 110. The substrate support member 112 is mounted on a stem 109 connected to a motor assembly 114 that raises and lowers the substrate support member 112 between a lowered loading/unloading position and the raised processing position. An opening 108 in the chamber 100 provides access for a robot (not shown) to deliver and retrieve substrates 110 to and from the chamber 100 while the substrate support member 112 is in the lowered loading/unloading position.

A coil 122 is mounted in the chamber 100 between the substrate support member 112 and the target 104 and provides magnetic fields in the chamber 100 during processing to assist in generating and maintaining a plasma between the target 104 and the substrate 110. The magnetic fields produced by the coil 122 induces currents in the plasma to densify the plasma which, in turn, ionizes the material sputtered from the target 104. The ionized material is then directed toward the substrate 110 and deposited thereon.

The chamber 100 includes a process kit comprising a process shield 128 and a shadow ring 129. The process shield 128 is an annular member suspended from the lid 102 between the coil 122 and the walls 101. An upwardly turned wall 131 of the process shield 128 is adapted to support the shadow ring 129 while the support member 112 is in a lowered position. To provide a return path for RF currents in the chamber 100, the process shield is preferably coupled to ground.

One or more plasma gases are supplied to the chamber 100 through a gas inlet 136 from gas sources 138, 140 as metered by respective mass flow controllers 142, 144. A vacuum system 146 is connected to the chamber 100 at an exhaust port 148 to exhaust the chamber 100 and maintain the desired pressure in the chamber 100. Preferably, the vacuum system 146 includes a cryopump and a roughing pump and is capable of sustaining a base pressure of about $10^{-8}$ mTorr (although the desired pressure is dependent on the particular application).

Multiple signal generators/power supplies are used in the chamber 100. A first signal generator 130 coupled to the target 104 provides a modulated signal thereto, such as a modulated DC or RF signal. A second signal generator 132 provides a modulated signal, preferably RF or DC, to the substrate support member 112 to bias the substrate 110. A third signal generator 134 supplies electrical power in the megahertz range to the coil 122 to increase the density of the plasma formed between the substrate 110 and the target 104 during processing. Each of the signal generators 130, 132 and 134 include circuitry adapted for the amplitude modulation of the respective output signals.

The operation of the chamber 100 and the various related components are preferably controlled by a conventional microprocessor/controller system 149. In particular, the microprocessor/controller system 149 generates signals that control the operation of the signal generators 130, 132, 134 as required to perform the processes of the invention described below.

In operation, a robot delivers a substrate 110 to the chamber 100 through the opening 108. After depositing the substrate 110 onto the upper support surface 105 of the substrate support member 112 the robot retracts from the chamber 100 and the opening 108 is sealed. The substrate support member 112 then raises the substrate 110 into a processing position. During the upward movement of the substrate support member 112, the shadow ring 129 is lifted from the process shield 128 to cover a perimeter portion (a few millimeters) of the substrate 110 to prevent deposition thereon during processing. Preferably, the distance between the target 104 and the substrate support member 112 in a raised processing position is about 90–200 mm and most preferably about 140 mm. One or more plasma gases are then introduced into the chamber 100 from the gas sources 138, 140 to stabilize the chamber 100 at a processing pressure. The magnets 106, which comprise components of a magnetron, facilitate the formation of a plasma adjacent the target 104, while the first signal generator 130 provides a bias which attracts the charged particles of the plasma toward the target 104 to cause sputtering therefrom. The coil 122 is energized by the third signal generator 134 and operates to increase the density of the plasma, thereby facilitating ionization of sputtered target material. A portion of the ions formed from the sputtered target material continue to traverse the processing region 107, between the target 104 and the substrate support member 112, and deposit on the substrate 110. Deposition onto the substrate 110 is enhanced by a bias on the substrate 110 provided by the second signal generator 132. Where the substrate 110 comprises a conductive material, or layer of material, the bias may be applied directly to the substrate 110. In cases where the substrate 110 comprises a non-conductive material, the bias voltage is capacitively coupled to the substrate 110 from the substrate support member 112. The power to the target 104, the substrate support member 112 and the coil 122 are controlled according to the processes described in detail below.

Following the deposition cycle, the substrate support member 112 is lowered to a loading/unloading position. The robot is then extended into the chamber 100 through the opening 108 and the substrate 110 is placed on the robot for removal from the chamber 100 and delivery to a subsequent location. Subsequent locations include various processing chambers, where the substrate 110 undergoes additional processing, such as electroplating chambers.

In a first embodiment of the invention, a deposition process is accomplished in two phases wherein the power to the coil 122 and the target 104 are modulated in phase and the power to the substrate support member 112 is modulated out of phase with respect to the coil 122 and target 104. This may be done using the microprocessor/controller 149 by executing files stored in a memory area (not shown), such as a hard disk, which is coupled to the microprocessor/controller 149. According to the particular file executed, the microprocessor/controller 149 transmits a corresponding signal to the signal generators 130, 132, and 134 which output the desired waveform to the target 104, the substrate support member 112 and the coil 122, respectively.

Figure 4:
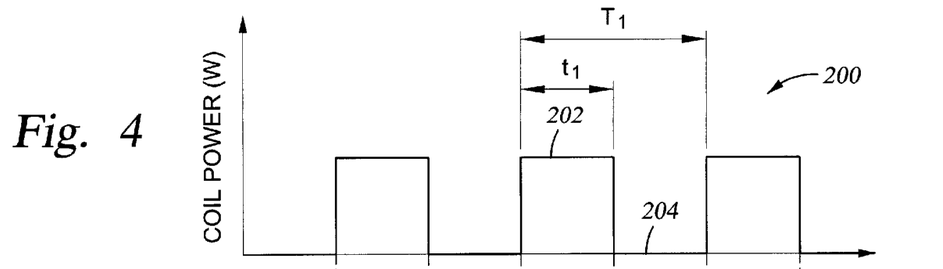
FIG. 4 is a graphical illustration of a modulated output signal provided to a coil.
Figure 5:
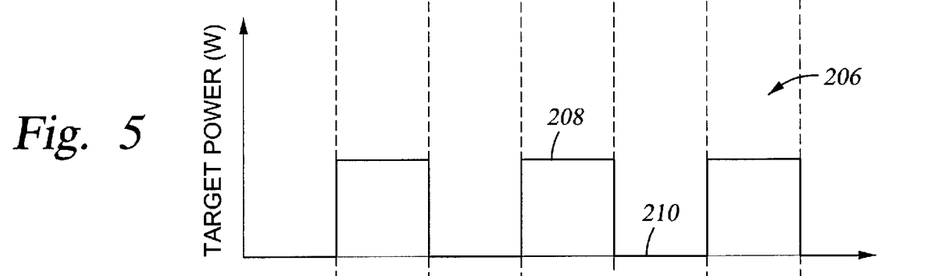
FIG. 5 is a graphical illustration of a modulated output signal provided to a target.
Figure 6:
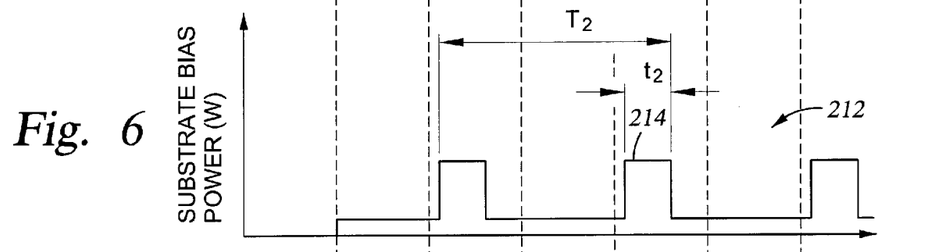
FIG. 6 is a graphical illustration of a modulated output signal provided to a substrate support member.
Figure 7:
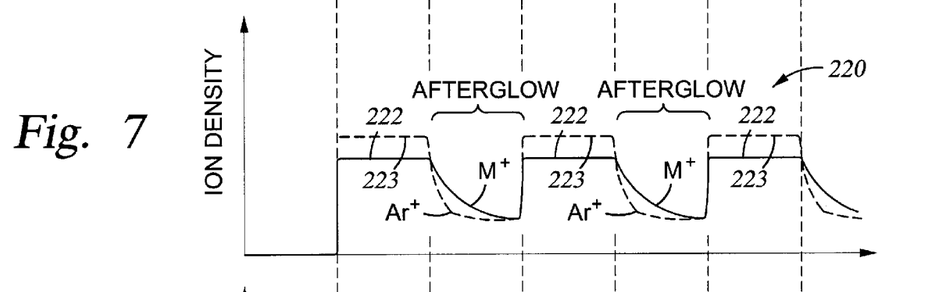
FIG. 7 is a graphical illustration of plasma decay.
Figure 8:
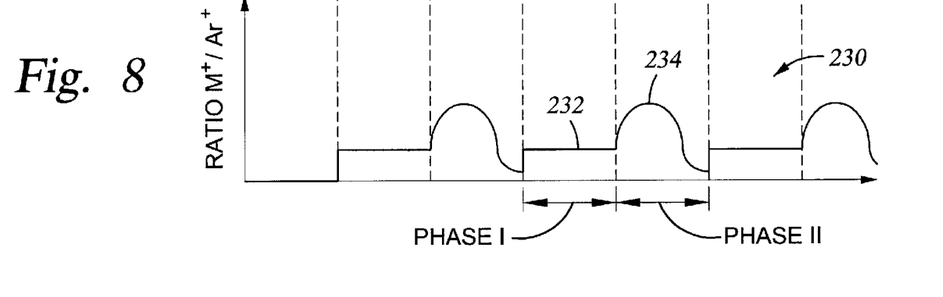
FIG. 8 is a graphical illustration of the ratio of ions in a plasma.

FIGS. 4–6 are graphical representations of the power supplied to the coil 122, target 104 and the substrate support member 112, respectively. FIG. 7 shows how the ion density of the plasma gas (in this case Ar) and target material ($M^+$) varies with time during phase I and phase II. FIG. 8 shows the ratio of metal ions to Ar ions, i.e., M+/Ar+.

Referring first to FIG. 4, the power to the coil 122 is shown. The coil power waveform 200 is defined by the power level supplied by the third signal generator 134. As indicated by the curve 200, the coil power is modulated between a power ON portion 202 during phase I for a time duration $t_1$ and a power OFF portion 204 during phase II. The total period of the curve 200 is shown as $T_1$. While the coil power is preferably completely terminated during phase II, in another embodiment the coil power during phase II may be some value less than the power during phase I, such that the coil power is modulated between two non-zero values.

The waveform 206 of the power to the target 104, as determined by the first signal generator 130, is shown in FIG. 5. The waveform 206 indicates that the target power is modulated between a power ON portion 208 (phase I) and a power OFF portion 210 (phase II). The target 104 is modulated in phase with the coil 122 so that the sputtered target material will be efficiently ionized in the inductively coupled plasma. During phase I, the power supplied to the target 104 is preferably constant to ensure a substantially constant sputtering rate.

The waveform 212 of the power supplied to the substrate support member 112 by the second signal generator 132 is shown in FIG. 6. In order to maintain an applied bias on the substrate support member 112, some level of power is preferably always supplied thereto. Thus, the support member power waveform 212 indicates a periodic pulse 214 from a lower power level to a higher power level. However, in another embodiment, the signal to the substrate support member 112 may be periodically supplied so that the waveform 212 includes a power ON portion and power OFF portion. Comparison of FIGS. 4 and 6 shows that the pulse 214 is provided out of phase with the coil power ON portion 202 and the target power ON portion 208. That is, the pulse 214 is provided during phase II at which time no power is supplied to the coil 122 and the target 104. Additionally, FIG. 6 shows the time duration $t_2$ of the pulse 214 is less than that of the power OFF portion 204 of the waveform 200 shown in FIG. 4 and is maintained only during an initial portion of phase II. The pulse 214 is timed to occur concurrently with an increase in the ratio of the metal ions to Ar ions in the plasma (M+/Ar+) as will be described below with reference to FIG. 8.

The waveforms 200, 206, and 212 will now be described in the context of a two phase deposition process with reference to FIG. 7. FIG. 7 illustrates the ion density of the plasma maintained in the chamber 100 shown in FIG. 3. Where necessary, occasional reference is made to FIG. 3.

In operation, a plasma is struck in the chamber 100 during phase I according to conventional methods previously described. Thus, a plasma gas is flowed into the chamber 100 and the target 104 and the coil 122 are energized to provide a plasma of sufficient density capable of ionizing sputtered target material. Illustratively, the ion density curve 220 shown in FIG. 7 represents the ion density of ionized argon (Ar+, represented by a dashed line) and a metal (M+). The metal may be any material being deposited on a substrate such as copper, tungsten, aluminum, titanium and the like. After ignition, the constituents of the plasma rapidly stabilize (typically in just a few microseconds) at given ion densities during phase I, as represented by plateau 222 (M+) and plateau 223 (Ar+). As shown, the density of argon ions is higher than that of the metal ions which is typically the case because of argon's relatively low ionization energy as compared to the ionization energy of metals commonly sputtered. The actual relative proportions of ion densities will depend on the ionization energies of the plasma gases and the sputtered target material as well as the process conditions. The ratio of argon ions to metal ions, i.e., M+/Ar+, is by a curve 230 shown in FIG. 8. A plateau 232 indicates that the ratio of ions has reached a stabile value during phase I. Once the plasma stabilizes, the power signals to the coil 122, the substrate support member 112 and the target 104 are modulated according to the invention.

During phase I of the two phase deposition process, power is supplied to both the coil 122 and the target 104 as shown by the power ON portions 202, 208 of the waveforms 200 and 206 in FIGS. 4 and 5, respectively. The negative bias on the target 104 attracts positive ions from the plasma and causes sputtering from the target surface. The sputtered material is then ionized by the plasma and deposited on the substrate 110. The directionality of the metal ions is influenced by the bias provided to the substrate support member 112, shown as waveform 212 in FIG. 6. During phase I, the power to the substrate support member 112 is substantially constant and is sufficiently low to avoid re-sputtering and faceting of the material deposited on the substrate 110. Alternatively, as noted above, the power to the substrate support member 112 may be completely terminated during phase I. Due to the interaction with the plasma, a self-bias will be sustained on the substrate 110 and cause attraction of the metal ions thereto. As a result of the minimized bias on the substrate 110, the angular distribution of metal ions (M+) will approximate a cosine distribution providing a relatively higher deposition rate on the sidewalls of the features formed in the substrate 110.

Subsequently, during phase II, the power to the coil 122 and the target 104 is turned off as shown by the power OFF portions 204, 210 in FIGS. 4 and 5. Because the plasma is sustained by the energized coil 122, the plasma begins to decay upon termination of power to the coil 122, as illustrated in FIG. 7. This results because the energized coil 122 provides the energy necessary to sustain the particles in the chamber in an ionized state. Upon terminating the coil power, the available energy quickly dissipates to a value insufficient to maintain the plasma resulting in recombination of the ionized particles with electrons. As a result, the ion density falls off exponentially during a plasma condition known as the afterglow. However, because ion recombination rate is dependent on ion mass, the plasma gas ions and the metal ions M+ decrease at different rates. In particular, heavier ions recombine more slowly than relatively lighter ions. In the case of Ar (molar mass=39.948 g/mol) and Cu (molar mass=63.54 g/mol), for example, the Cu ion density is believed to decrease only about 0.75 times as fast as the Ar ion density. Thus, during phase I, the Ar density exhibits a more rapid rate of decrease than the M+ decay, as shown in FIG. 7. The result is an increase the ratio of metal ions to Ar ions in the processing chamber, which is indicated by a peak 234 in the ion ratio curve 230 of FIG. 8.

The present invention uses to advantage the varying ion recombination rates of different gases by providing a high bias to the substrate support member 112 during a portion of the plasma afterglow and particularly during the peak 234 of the ion ratio curve 230 shown in FIG. 8. Thus, the plasma is allowed to decay for a period of time during phase II in order to establish a relative increase in the ratio of metal ions (M+) to argon ions (Ar+). As shown in FIG. 6, the power to the support member 112 is increased during phase II to a level which under conventional methods would cause re-sputtering and faceting. The undesirable effects of re-sputtering and faceting are avoided because the ratio of metal ions to Ar ions during the pulse 214 is relatively higher than during phase I. Further, as a result of the increased bias on the substrate being processed, the metal ions are accelerated with greater perpendicularity toward the bottom of the features formed in the substrate, thereby achieving a higher deposition rate on the bottom.

The power to the target 104 is preferably terminated during phase II to prevent further sputtering of material from the target 104. Because the plasma during phase II is in a state of decay, the electron energy quickly falls to a value insufficient to ionize sputtered material. Thus, continued application of power to the target 104 would result in the deposition of un-ionized metal on the substrate 110. Because the un-ionized metal cannot be influenced by the bias on the substrate 110, the angular distribution of the sputtered material would result in less perpendicularity relative to the substrate 110. As a result, continued application of power to the target 104 may produce non-conformal step coverage. In particular, more sidewall deposition would result on the devices formed in the substrate 110 during phase II. However, although not preferred, the invention contemplates supplying some level of power to the target 104 in certain cases. For example, where more sidewall coverage is desired, a predetermined level of power may be supplied to the target 104 during phase II. The predetermined level of power may be the same as or different from the power supplied to the target 104 in phase I.

By controlling the power level to the coil 122, target 104 and substrate support member 112, and by adjusting the duty cycle of the waveforms 200, 206 and 212, the desired proportions of bottom and sidewall coverage of the features formed in the substrate 110 are possible. In one embodiment, the coil power may be modulated between 5 kW (phase I) and 0kW (phase II). In general, the duty cycle of the coil power, $t_1/T_1$, is preferably between about 0.1% and 50% and most preferably about 50%, while the pulse width, $t_1$, is between about 10 $\mu$s and 10 ms and a frequency ($1/T_1$) between about 20 KHz and 100 KHz. If the duty cycle of the signal to the coil 122 is too high the coverage of the features can suffer. The poor coverage results because no applied bias is provided to the substrate while the coil 122 is energized, thereby producing proportionately higher deposition on the sidewalls as compared to the bottoms of the features. Thus, the duty cycle is selected to optimize bottom and sidewall coverage in order to achieve conformal step coverage. The power to the target 104 is preferably modulated in phase with the coil power and with the same duty cycle and frequency, as shown in FIG. 5. The power to the substrate support member 112 is modulated with the same frequency as the coil power and target power but out of phase relative thereto, i.e., the pulse 214 is provided during phase II. Further, the pulse 214 is only maintained for a portion of phase II. In particular, the power to the substrate support member 112 is selected to provide a relatively higher bias on the substrate being processed only during the portion of the afterglow wherein the ratio M+/Ar+ is sufficiently high as shown by FIGS. 6 and 8. Thus, in one embodiment where the duty cycle of the power to the coil 122 is about 50%, the duty cycle ($t_2/T_2$) of the waveform 212 (the power to the substrate support member 112) is between about 10% and 25% and $t_2$ is between about 1 $\mu$s and 20 $\mu$s. It is understood that the foregoing values are merely illustrative and other values may be used to advantage depending on the particular application and desired result.

As noted above, the rate at which ion densities decrease during the afterglow is dependent on ion mass. Because heavier ions recombine more slowly than relatively lighter ions, the plasma gas used during processing may be selected from a group comprising relatively lighter atoms, such as neon (molar mass=20.183 g/mol) or helium (molar mass= 4.0026 g/mol). In theory, the lighter the plasma gas the higher the possible ratio of metal ions to plasma gas ions during the afterglow. As a result, the undesirable effects of re-sputtering during application of a high bias to the substrate support member 112 may be controlled by selecting the plasma gas according to its molar mass.

While the foregoing is directed to the preferred embodiment of the present invention, other and further embodiments of the invention may be devised without departing from the basic scope thereof, and the scope thereof is determined by the claims that follow.

What is claimed is:

1. A plasma processing system, comprising:
   (a) a processing chamber body forming a cavity;
   (b) a target disposed proximate the cavity;
   (c) a substrate support member disposed proximate the cavity;
   (d) a plasma generator disposed proximate the cavity; and
   (e) a first modulated power source adapted to supply a first modulated signal to the plasma generator and a second modulated power source adapted to supply a second modulated signal to the substrate support member, wherein the first and the second modulated signals are out of phase relative to one another.

2. The system of claim 1, wherein a third modulated power source is adapted to supply a third modulated signal to the target in phase with the first modulated signal.

3. The system of claim 1, wherein the plasma generator is a coil coupled to a modulated RF source.

4. A method of depositing material on a substrate in a process chamber, comprising:
   (a) providing a first signal to the substrate;
   (b) providing a second signal to a target disposed in the process chamber;
   (c) providing a third signal to an inductive coil;
   (d) providing a plasma in the process chamber adapted to ionize a material sputtered from the target;
   (e) modulating the first signal during at least a first phase and a second phase, wherein the first signal is relatively lower during the first phase than at least a portion of the second phase;
   (f) modulating the third signal to be relatively higher during the first phase than during the second phase; and
   (g) depositing the material sputtered from the target onto the substrate.

5. The method of claim 4, wherein the plasma comprises a gas selected from the group consisting of argon, neon, helium and any combination thereof.

6. The method of claim 4, wherein (d) comprises supplying a modulated radio frequency (RF) signal to the substrate.

7. The method of claim 4, wherein (b) comprises supplying a modulated DC signal to the target.

8. The method of claim 4, wherein the second signal is relatively higher during the first phase than during the second phase.

9. The method of claim 4, wherein the second signal is modulated between an ON portion during the first phase and an OFF portion during the second phase.

10. The method of claim 4, wherein (e) comprises periodically allowing the plasma to decay.

11. The method of claim 10, wherein the first signal is modulated during a period of time in which the plasma decays.

12. The method of claim 4, whether the third signal is about 5 kW during the first phase and about 0 kW during the second phase.

13. A method for depositing a material onto a substrate, comprising:
   (a) creating a plasma in a vacuum chamber;
   (b) sputtering material from a target disposed in the vacuum chamber;
   (c) modulating a first signal supplied to an inductive coil disposed in the vacuum chamber in order to affect the plasma;
   (d) modulating a bias on the substrate by providing a second signal to the substrate out of phase with the first signal; and
   (e) depositing the material sputtered from the target onto the substrate.

14. The method of claim 13, wherein the plasma comprises a gas selected from the group consisting of argon, neon, helium and any combination thereof.

15. The method of claim 13, wherein the second signal is modulated to a relatively higher power during a plasma afterglow period during which the plasma decays.

16. The method of claim 13, further comprising modulating a third signal to the target.

17. The method of claim 13, further comprising modulating a third signal to the target in phase with the first signal.

18. The method of claim 13, wherein the second signal is modulated between an ON portion and an OFF portion.

19. The method of claim 13, wherein (c) comprises modulating the first signal between an ON portion and an OFF portion.

20. The method of claim 13, wherein (c) comprises modulating the first signal between at least a first power and a second power, wherein the second power is greater than the first power.

21. The method of claim 20, wherein (d) comprises modulating a second signal applied to the substrate between at least a third power and a fourth power, wherein the third power is less than the fourth power and wherein the fourth power is provided simultaneously with the second power.

22. A method of depositing material on a substrate in a process chamber, comprising:
   (a) providing a first signal to the substrate;
   (b) providing a second signal to a target disposed in the process chamber;
   (c) providing a plasma in the process chamber adapted to ionize a material sputtered from the target;
   (d) modulating at least the first signal;

(e) modulating a density of the plasma to periodically allow the plasma to decay; and (f) depositing the material sputtered from the target onto the substrate.

23. The method of claim 22, wherein the first signal is modulated during a period of time in which the plasma decays.

24. A method for depositing a material onto a substrate, comprising:

(a) creating a plasma in a vacuum chamber;

(b) sputtering material from a target disposed in the vacuum chamber;

(c) modulating a first signal supplied to an inductive coil disposed in the vacuum chamber to affect the plasma;

(d) modulating a bias on the substrate by providing a second signal to the substrate out-of-phase with the first signal so that while a power provided to the substrate is increased, a power provided to the inductive coil is decreased; and (e) depositing the material sputtered from the target on to the substrate.

25. A method for depositing a material onto a substrate, comprising:

(a) creating a plasma in a vacuum chamber;

(b) sputtering material from a target disposed in the vacuum chamber;

(c) modulating a first signal supplied to an inductive coil disposed in the vacuum chamber to affect the plasma;

(d) modulating a bias on the substrate;

(e) modulating a second signal to the target in phase with the first signal; and (f) depositing the material sputtered from the target onto the substrate.

26. A method for depositing a material onto a substrate, comprising:

(a) creating a plasma in a vacuum chamber;

(b) sputtering material from a target disposed in the vacuum chamber;

(c) modulating a first signal supplied to an inductive coil disposed in the vacuum chamber to affect the plasma by modulating the first signal between at least a first power and a second power, wherein the second power is greater than the first power;

(d) modulating a bias on the substrate by modulating a second signal applied to the substrate between at least a third power and a fourth power, wherein the third power is less than the fourth power and wherein the fourth power is provided simultaneously with the second power; and (e) depositing the material sputtered from the target onto the substrate.

* * * * *

UNITED STATES PATENT AND TRADEMARK OFFICE
CERTIFICATE OF CORRECTION

PATENT NO.     : 6,193,855 B1
DATED          : February 27, 2001
INVENTOR(S)    : Praburam Gopalraja et al.

It is certified that error appears in the above-identified patent and that said Letters Patent is hereby corrected as shown below:

Title page,
Item [74], *Attorney, Agent, or Firm*, please change "Pattersor" to -- Patterson --.

Column 2,
Line 6, please change "comers" to -- corners --.

Column 8,
Line 3, please change "increase the ratio" to -- increase in the ratio --.
Line 51, please change "0kW" to -- 0 kW --.

Signed and Sealed this

Fifteenth Day of October, 2002

*Attest:*

*Attesting Officer*

JAMES E. ROGAN
*Director of the United States Patent and Trademark Office*